United States Patent
Unrau et al.

(10) Patent No.: US 10,311,167 B1
(45) Date of Patent: Jun. 4, 2019

(54) HORIZONTAL AND VERTICAL GEOMETRY MANIPULATORS

(71) Applicant: Bentley Systems, Incorporated, Exton, PA (US)

(72) Inventors: Vincent Unrau, Exton, PA (US); Vernon Francisco, Exton, PA (US)

(73) Assignee: Bentley Systems, Incorporated, Exton, PA (US)

( * ) Notice: Subject to any disclaimer, the term of this patent is extended or adjusted under 35 U.S.C. 154(b) by 332 days.

(21) Appl. No.: 15/450,871

(22) Filed: Mar. 6, 2017

(51) Int. Cl.
   *G06F 17/50* (2006.01)
   *G06F 3/0481* (2013.01)
   *G06F 3/0484* (2013.01)

(52) U.S. Cl.
   CPC .......... *G06F 17/50* (2013.01); *G06F 3/04815* (2013.01); *G06F 3/04845* (2013.01)

(58) Field of Classification Search
   CPC ... G06F 17/50; G06F 3/04815; G06F 3/04845
   USPC ............................................................ 703/1
   See application file for complete search history.

(56) References Cited

U.S. PATENT DOCUMENTS

| 6,041,171 | A | | 3/2000 | Blaisdell et al. | |
|---|---|---|---|---|---|
| 6,113,335 | A | * | 9/2000 | Kamiwaki | B65G 67/606 414/139.6 |
| 2014/0214384 | A1 | * | 7/2014 | Kawahito | G06F 17/5009 703/6 |

FOREIGN PATENT DOCUMENTS

WO   WO-2006121641 A2   11/2006

OTHER PUBLICATIONS

"Belt Conveyor Design Program," HELIX delta-T for WINDOWS—Professional Version 6, Helix Technologies, Jul. 27, 2016, pp. 1-3.

(Continued)

*Primary Examiner* — Andre Pierre Louis
(74) *Attorney, Agent, or Firm* — Cesari and McKenna, LLP; James A. Blanchette (57) ABSTRACT

In one embodiment, a view of the one or more elements that represent a generally linear unit of infrastructure is displayed in a GUI of the CAD application. The CAD application generates one or more horizontal geometry manipulators and one or more vertical geometry manipulators attached along the one or more elements. In response to user input moving a horizontal geometry manipulator to a new position in 3D space, the CAD application determines a horizontal position along the one or more elements, recreates 2D horizontal geometry of the one or more elements to be tangent to the horizontal position, recreates 2D vertical geometry to maintain elevation, repositions the one or more vertical geometry manipulators along the one or more elements, and updates the view of the one or more elements in 3D space. In response to user input moving a vertical geometry manipulator to a new position in 3D space, the CAD application determines a vertical position along the one or more elements, recreates 2D vertical geometry of the one or more elements to adjust elevation based on the vertical position, and updates the view of the one or more elements in 3D space.

20 Claims, 13 Drawing Sheets

(56) References Cited

OTHER PUBLICATIONS

"Overview," AC-Tek (Advanced Conveyor Technologies), <http://www.conveyorsoftware.net/design/>, Oct. 12, 2016, pp. 1-9.
Smith, Simon, et al., "MineCycle™ Material Handling: Faster, More Competitive Bulk Material Handling Designs," Bentley Systems, Incorporated, created Mar. 16, 2016, pp. 1-18.

* cited by examiner

HORIZONTAL AND VERTICAL GEOMETRY MANIPULATORS

BACKGROUND

Technical Field

The present disclosure relates generally to infrastructure modeling, and more specifically to techniques for manipulating the geometry of elements that represent generally linear units of infrastructure.

Background Information

Computer aided design (CAD) applications are often used to model of infrastructure (i.e., civil infrastructure projects, utility or transportation networks, buildings, or other types of physical structures) in three dimensions (3D). One specific application of infrastructure modeling is mining materials handling, where a user may desire to model conveyors, haul roads, and other generally linear-structures. The user may place one or more elements (e.g., that represent a conveyor, haul road, etc.) in 3D space and then desire to manipulate their geometry so that they clear other elements that represent existing structures (e.g., buildings, other conveyors, etc.) and interact with elements that represent other components of an overall system (e.g., mills, screens, crushers, etc.).

Traditionally, to manipulate the geometry of elements that represent generally linear infrastructure, a user would need to separately modify a two-dimensional (2D) vertical profile of the elements and a 2D horizontal profile of the elements. These separate modifications would typically be conducted in dedicated interfaces of the CAD application, separate from each other and any 3D view. Accordingly, it was typically difficult for a user to visualize how the elements would be positioned with respect other elements, and how they would interact with other elements.

Accordingly, there is a need for improved techniques for manipulating the geometry of elements that represent generally linear units of infrastructure in a CAD application.

SUMMARY

Horizontal geometry manipulators and vertical geometry manipulators may be provided for manipulating the geometry of one or more elements that represent a generally linear unit of infrastructure in a CAD application. In one specific embodiment, a view of the one or more elements that represent generally linear units of infrastructure is displayed in 3D space in a graphical user interface (GUI) of the CAD application. The CAD application generates one or more horizontal geometry manipulators attached along the one or more elements. Each horizontal geometry manipulator is visualized in the view, and movable in the 3D space. The CAD application generates one or more vertical geometry manipulators attached along the one or more elements. Each vertical geometry manipulator is visualized in the view and movable in the 3D space. In response to user input in the GUI moving a horizontal geometry manipulator to a new position in 3D space, the CAD application determines a horizontal position along the one or more elements, recreates 2D horizontal geometry of the one or more elements to be tangent to the horizontal position, recreates 2D vertical geometry to maintain elevation, repositions the one or more vertical geometry manipulators along the one or more elements, and updates the view of the one or more elements in 3D space in the GUI. In response to user input in the GUI moving a vertical geometry manipulator to a new position in 3D space, the CAD application determines a vertical position along the one or more elements, recreates 2D vertical geometry of the one or more elements to adjust elevation based on the vertical position, and updates the view of the one or more elements in 3D space in the GUI.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
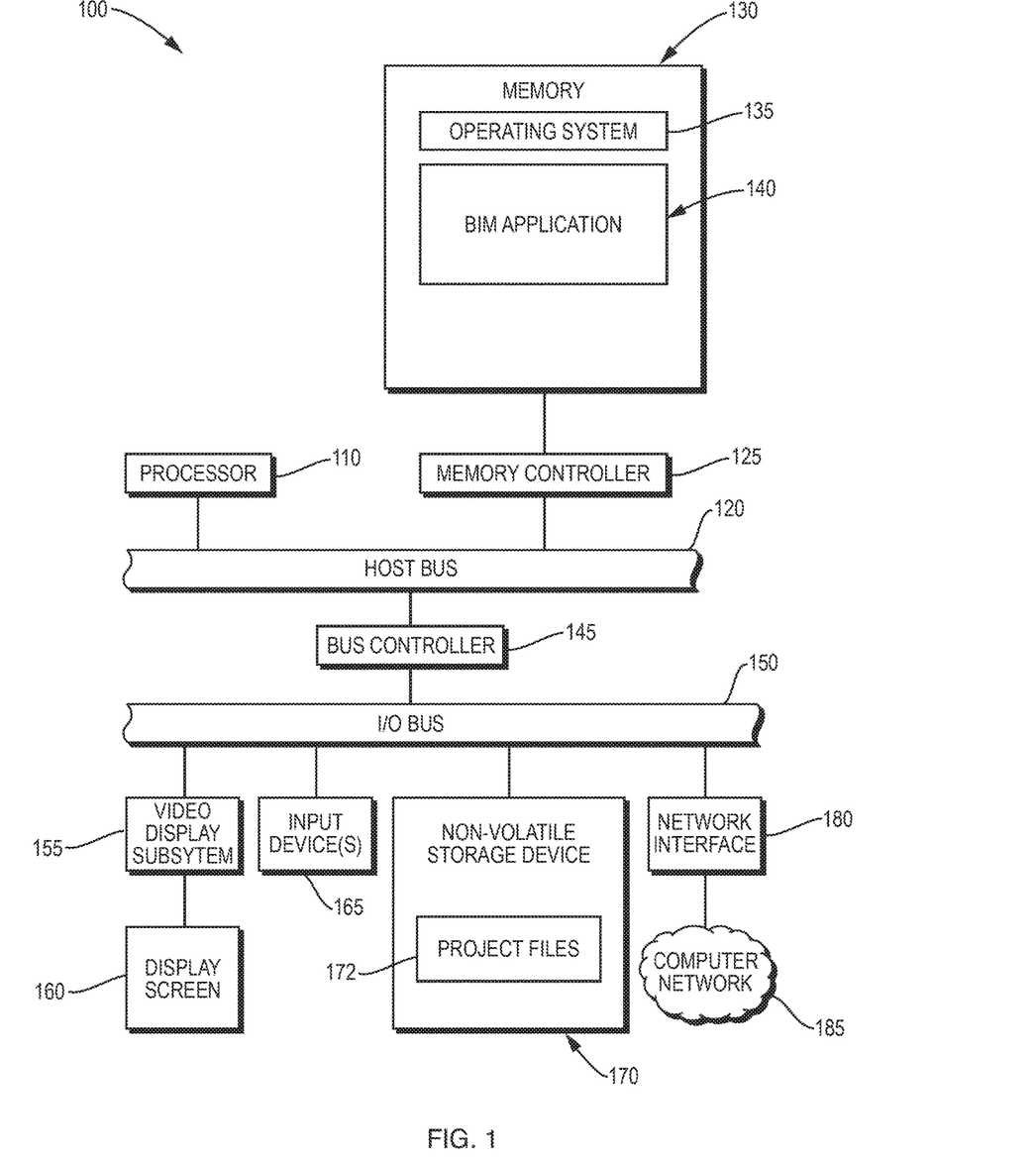
FIG. 1 is a block diagram of an example electronic device in which at least some of the presently described techniques may be employed.

FIG. 1 is a block diagram of an example electronic device 100 in which at least some of the presently described techniques may be employed. The electronic device may be designed for stationary operation (e.g., may be a desktop computer), or may be a portable electronic device (e.g., a notebook computer, a tablet computer, etc.) designed to be readily transported by a user and utilized from a variety of different locations. The electronic device 100 includes at least one processor 110 coupled to a host bus 120. A volatile memory 130, such as a random access memory (RAM), is coupled to the host bus 120 via a memory controller 125 and configured to store an in-memory copy of software and data. The in-memory copy of software may include executable instructions for an operating system 135 and a CAD application 140, among other software. In some specific implementations, the CAD application 140 is the Bentley Mine-Cycle™ Bulk Material Handling Design Software available from Bentley Systems, Inc. of Exton, Pa. Such software is loaded into the volatile memory 130 when needed from persistent copies of the software (not shown) maintained on a non-volatile storage device 170 (e.g., a hard disk, a solid-state drive, etc.) The in-memory copy of data may include an in-memory copy of project files 172 used by the CAD application 140.

The host bus 120 of the electronic device 100 is coupled to an input/output (I/O) bus 150 through a bus controller 145. A video display subsystem 155 that includes a display screen 160 is coupled to the I/O bus 150. The display screen 160 may show a graphical user interface (GUI) of the CAD application 140, as well as user interfaces of other software executed on the electronic device 100. One or more input devices 165 (e.g., a mouse, keyboard, touch sensor, etc.) are also coupled to the I/O bus 150. The input devices 165, among other uses, are used to interact with the CAD application 140. The above-discussed non-volatile storage device 170, and a network interface 180, are coupled to the I/O bus 150.

The network interface 180 may be coupled to a computer network 185 (e.g., the Internet) to allow for communication between the electronic device 100 and other electronic devices, using any of a number of well-known networking protocols, thereby enabling various distributed, collaborative or remote computing configurations. It should be understood that, according to such configurations, some, or all, of the software and data shown resident in memory 130 or stored in the non-volatile storage device 170 may be remotely located on another electronic device, and accessed via the computer network 185.

The non-volatile storage device 170, in addition to storing copies of the executable software, persistently stores copies of the project files 172 used by the CAD application 140. The project files 172 maintain a description of the infrastructure as a series of data structures that represent elements organized into models, associated with levels that help define graphical views. Elements generally describe individual units of infrastructure, and may be structured as 2D or 3D elements (which in some cases may be both simultaneously maintained for the same unit). At least some of the elements may represent generally linear units of infrastructure. In the mining materials handling context, a generally linear unit of infrastructure may be a conveyer, a haul road, or another substantially line-like portion of a mining materials handling system.

Models generally group together related elements into larger units, effectively "owning" a set of elements. In the mining materials handling context, a model may represent a particular mining or processing site, a plant, or other larger unit of infrastructure. A project consists of at least one model (e.g., a root model), and possibly additional models (e.g., attached models) organized under the root. A level generally describes selected elements that should be displayed (e.g., "turned on") and, in some cases, symbology that controls their visual appearance. Graphical views generally are representations of selected elements shown with certain symbology.

Figure 2:
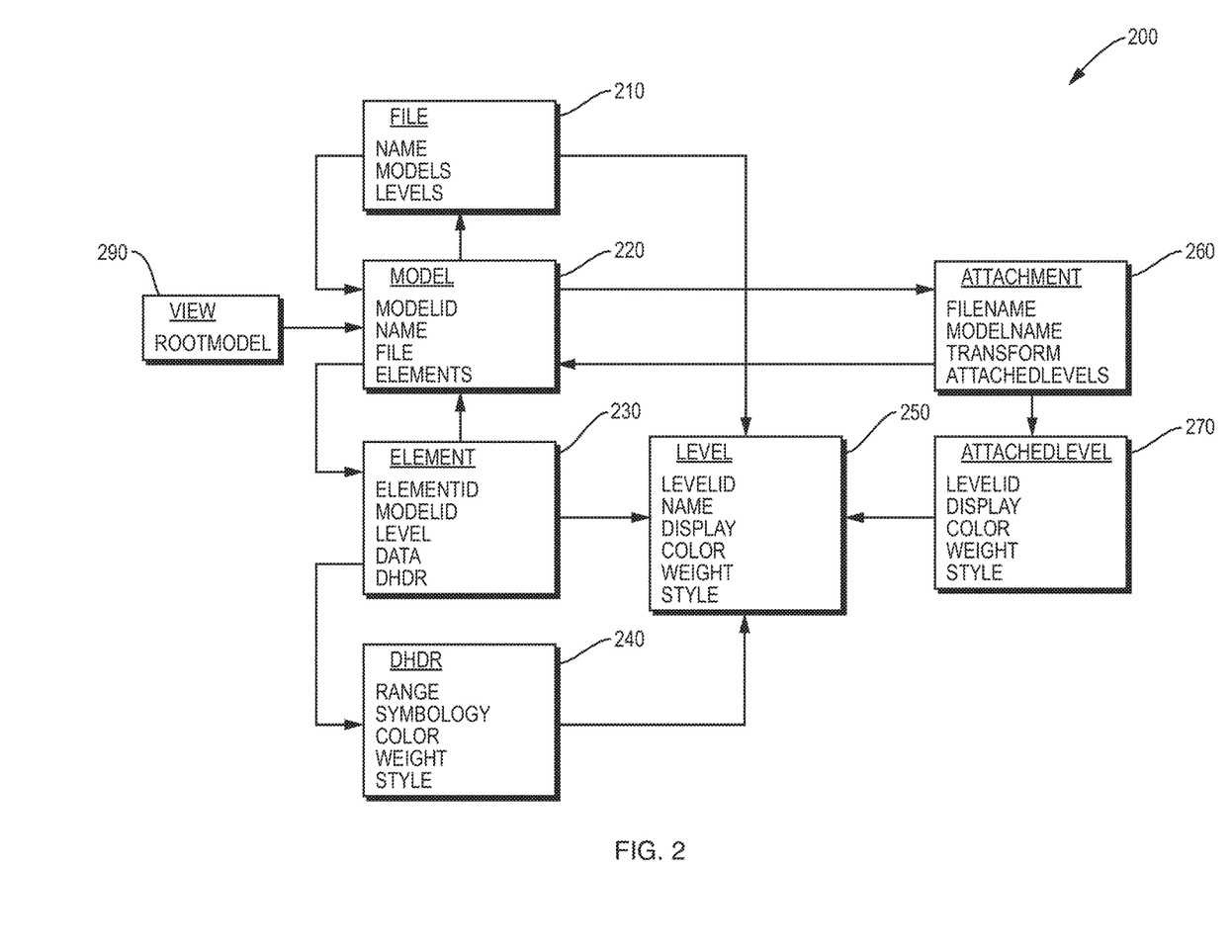
FIG. 2 is an example data structure diagram of project files.

In some specific implementations, the project files 172 are DgnV8 files that utilize a DgnV8 storage format compatible with CAD applications available from Bentley Systems, Inc. of Exton, Pa. However, it should be understood that other storage formats may be used in other CAD applications, available from other vendors. FIG. 2 is an example data structure diagram 200 of project files 172. In the data structure diagram 200, a file data structure 200 serves as a header and includes a name field that indicates a unique human readable name for the file, a models field that references model data structures contained in the file, and a levels field that references level data structures contained in the file. Each model data structure 220 represents an individual model and includes a model ID field that indicates a unique identifier for the model, a name field that indicates a unique human readable name for the model, a file field that references the owning file, and elements fields that reference element data structures owned by the model. Each element data structure 230 represents an individual 2D or 3D element owned by a model and includes an element ID field that indicates a unique identifier for the element, a model ID field that indicates the owning model data structure, a level field that indicates a level associated with the element, a data field that includes information describing the unit of infrastructure being represented by the element and its geometry, and a DHDR field that indicates an associated DHDR data structure. Each DHDR data structure 140 indicates range and symbology information that describes how the owning element should be rendered. Each element data structure may also reference a level data structure 150 for a level to which it belongs, which including a level ID field that indicates a unique identifier for the level, a name field that indicates a unique human-readable name for the level, a display field that indicates whether elements on the level should be displayed (e.g., "turned on"), and symbology fields that indicate overrides to the symbology of individual elements of the level.

During the design process, it is often desired to precisely yet rapidly manipulate the geometry of elements that represent generally linear units of infrastructure (e.g., maintained in a 3D and 2D element in a file) in order to clear other elements that serve as obstructions, interact with other elements that represent other components of an overall system or to otherwise meet design requirements. For example, in the mining materials handling context, it is often desirable to manipulate the geometry of one or more elements that represent a conveyor so to clear elements that represent existing buildings or other conveyors, and interact with elements that represent mills, screens, crushers, etc. To enable such manipulation, the CAD application 140 may provide horizontal geometry manipulators and vertical geometry manipulators in a view shown in the GUI of the CAD application 140. In response to user movement of the horizontal geometry manipulators in 3D space, 2D horizontal geometry is changed. In response to user movement of the vertical geometry manipulators in 3D space, 2D vertical geometry represented in is changed. In such manner, precise adjustment to 2D horizontal geometry and 2D vertical geometry is enabled in response to user movement in 3D space.

Figure 4A:
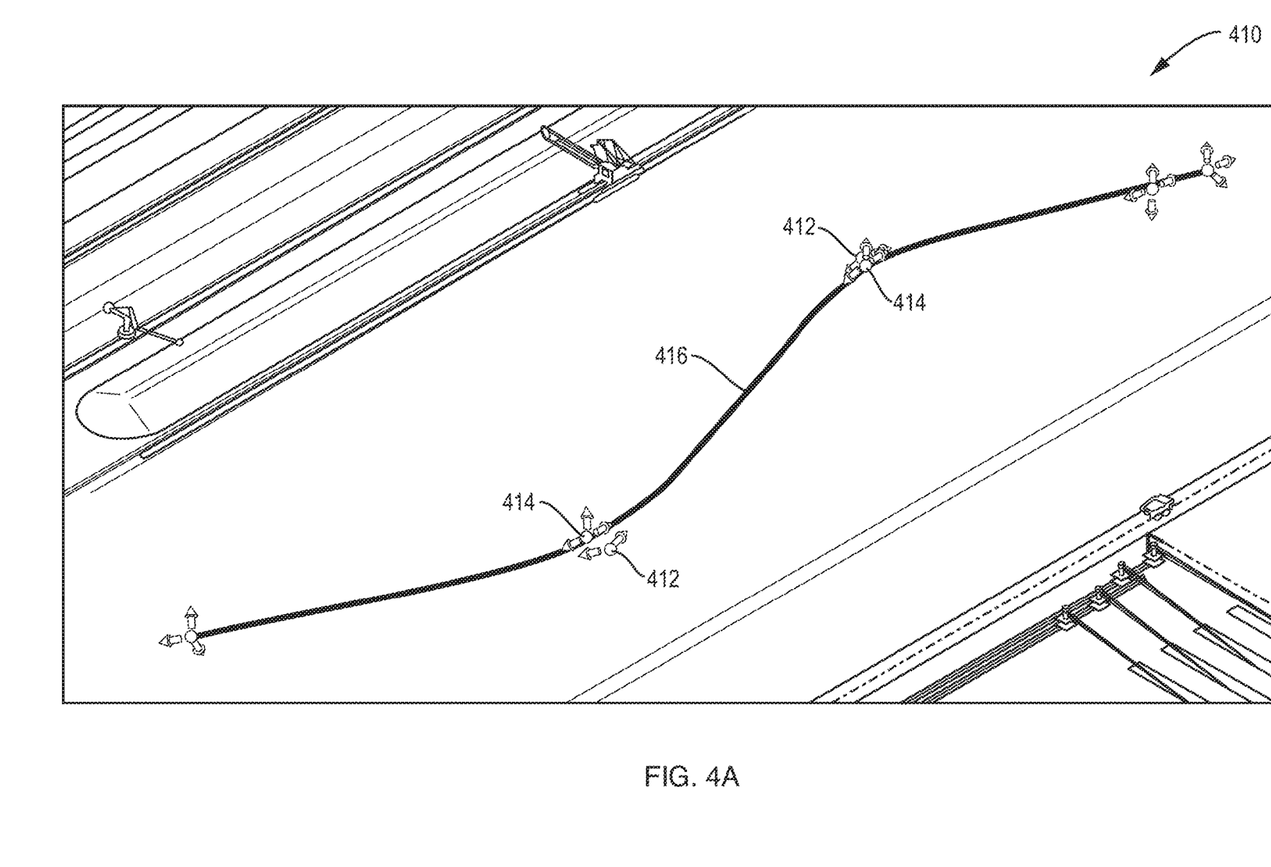
FIGS. 4A-4C are a progression of example isometric views of a conveyor in a GUI of a CAD application, showing a change in 2D horizontal geometry using horizontal geometry manipulators.
Figure 4B:
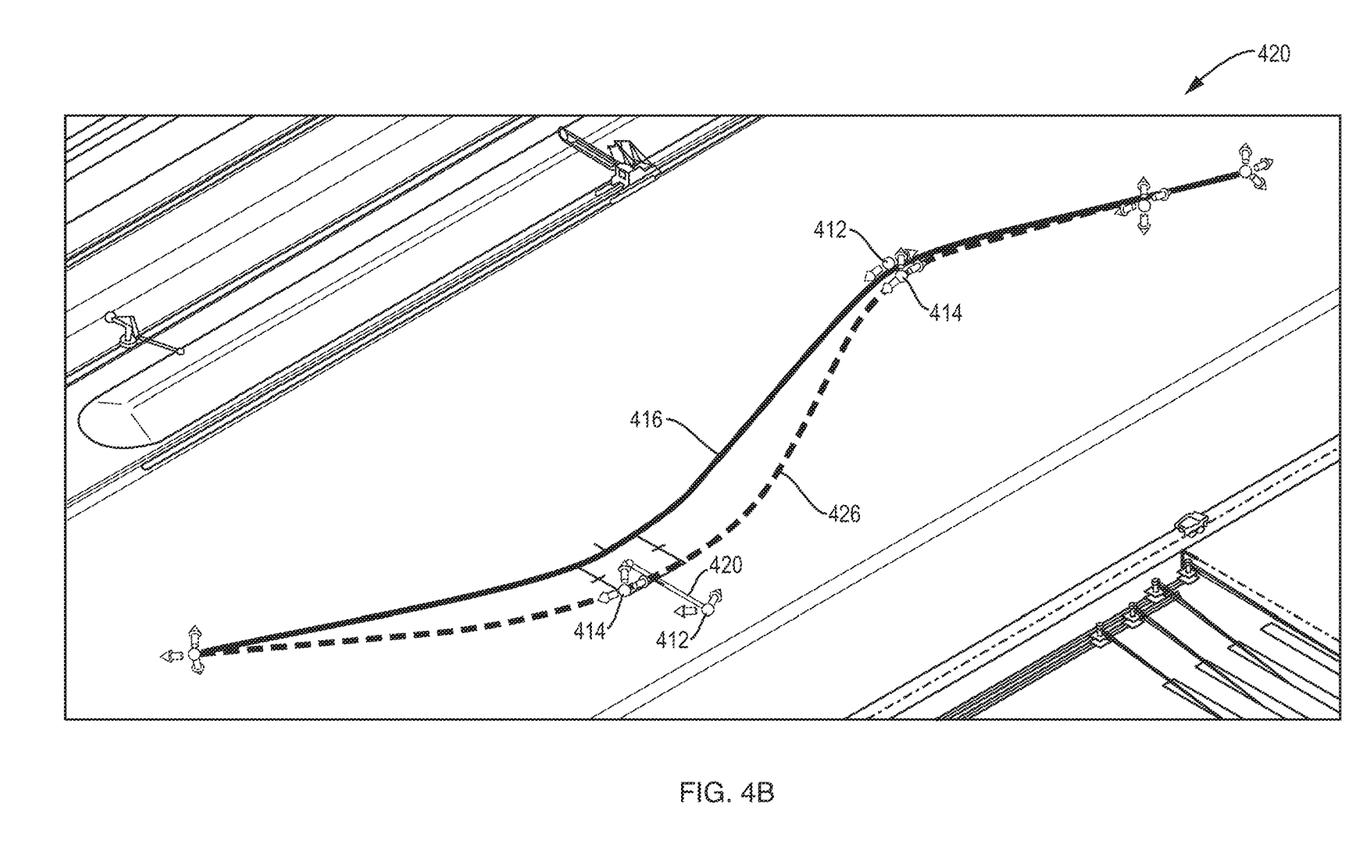
Figure 4C:
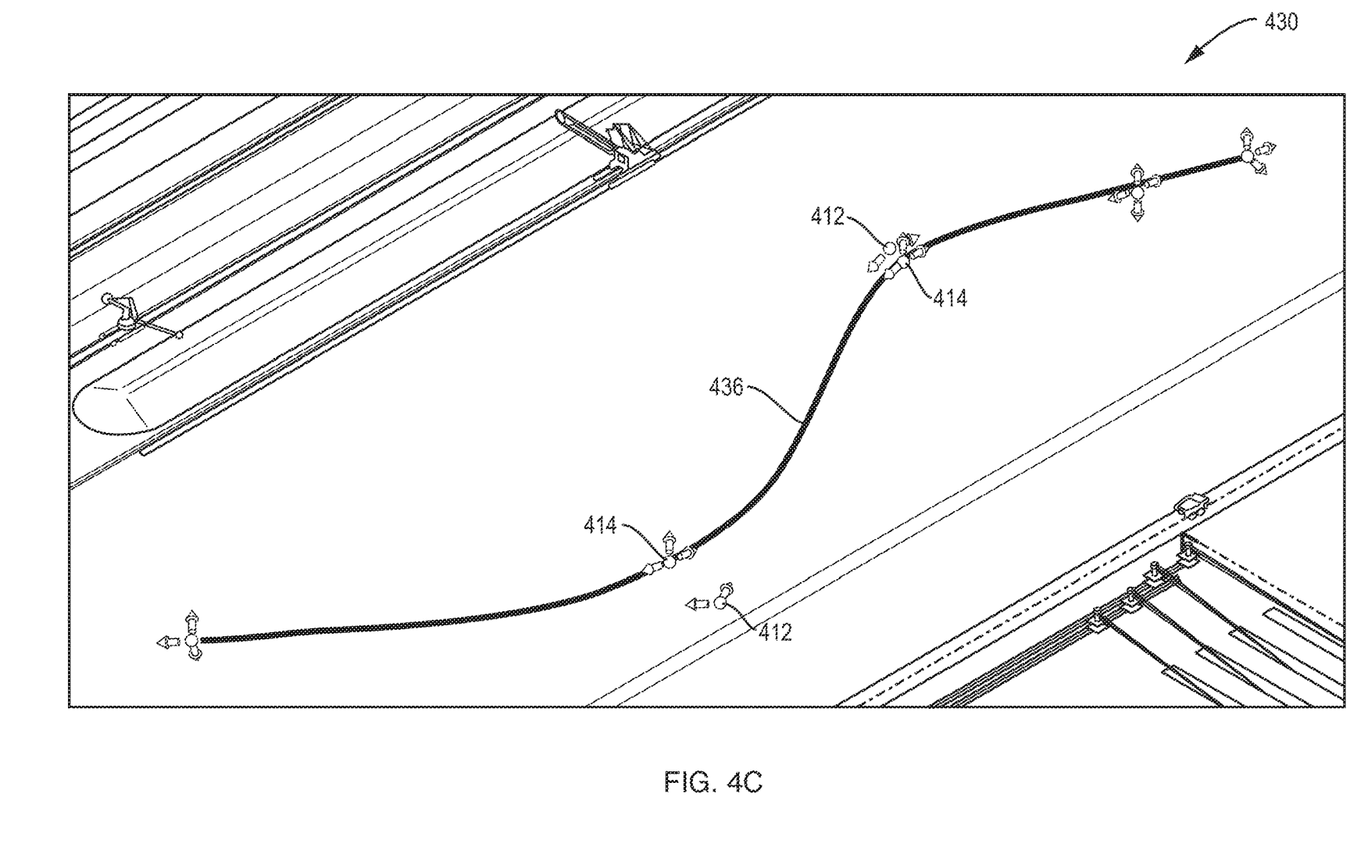
Figure 5A:
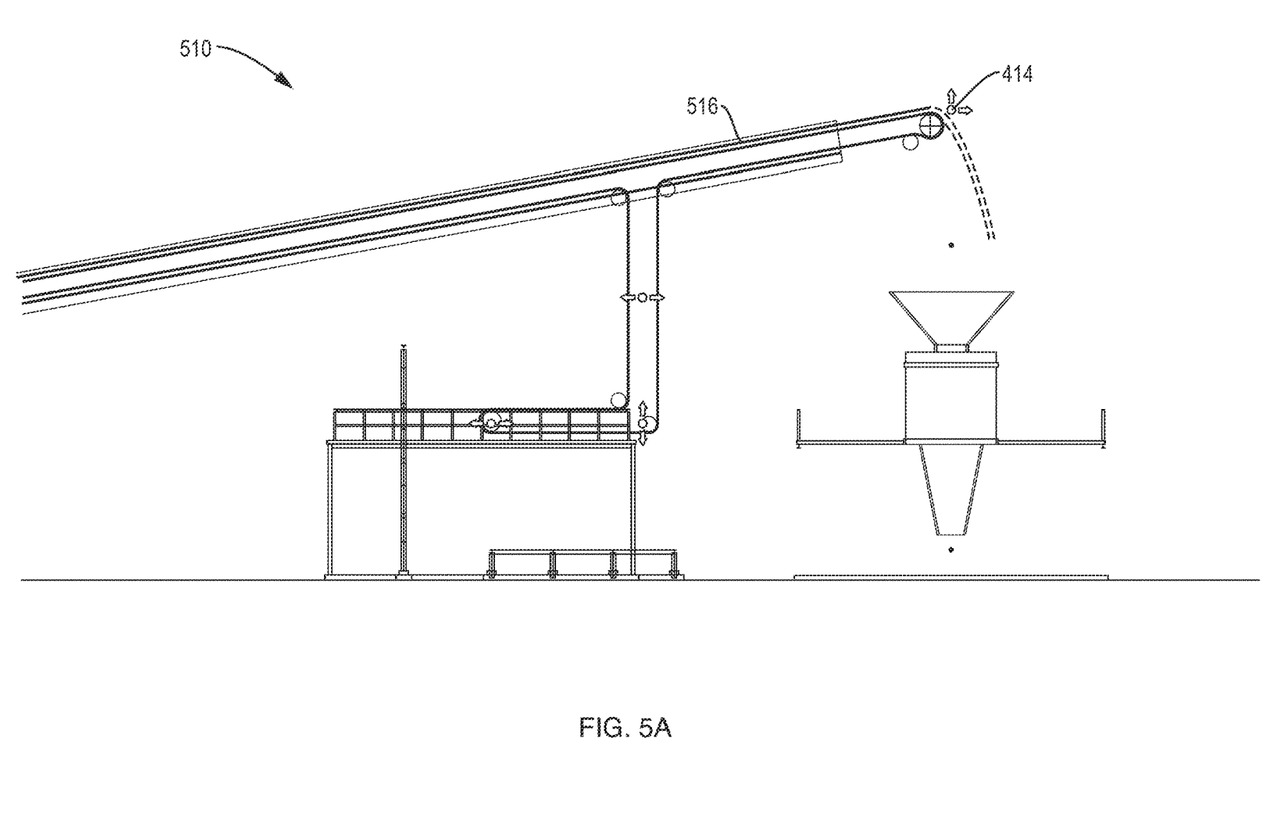
FIGS. 5A-5C are a progression of example elevation views of a conveyor in a GUI of a CAD application, showing a change in 2D vertical geometry using vertical geometry manipulators.
Figure 5B:
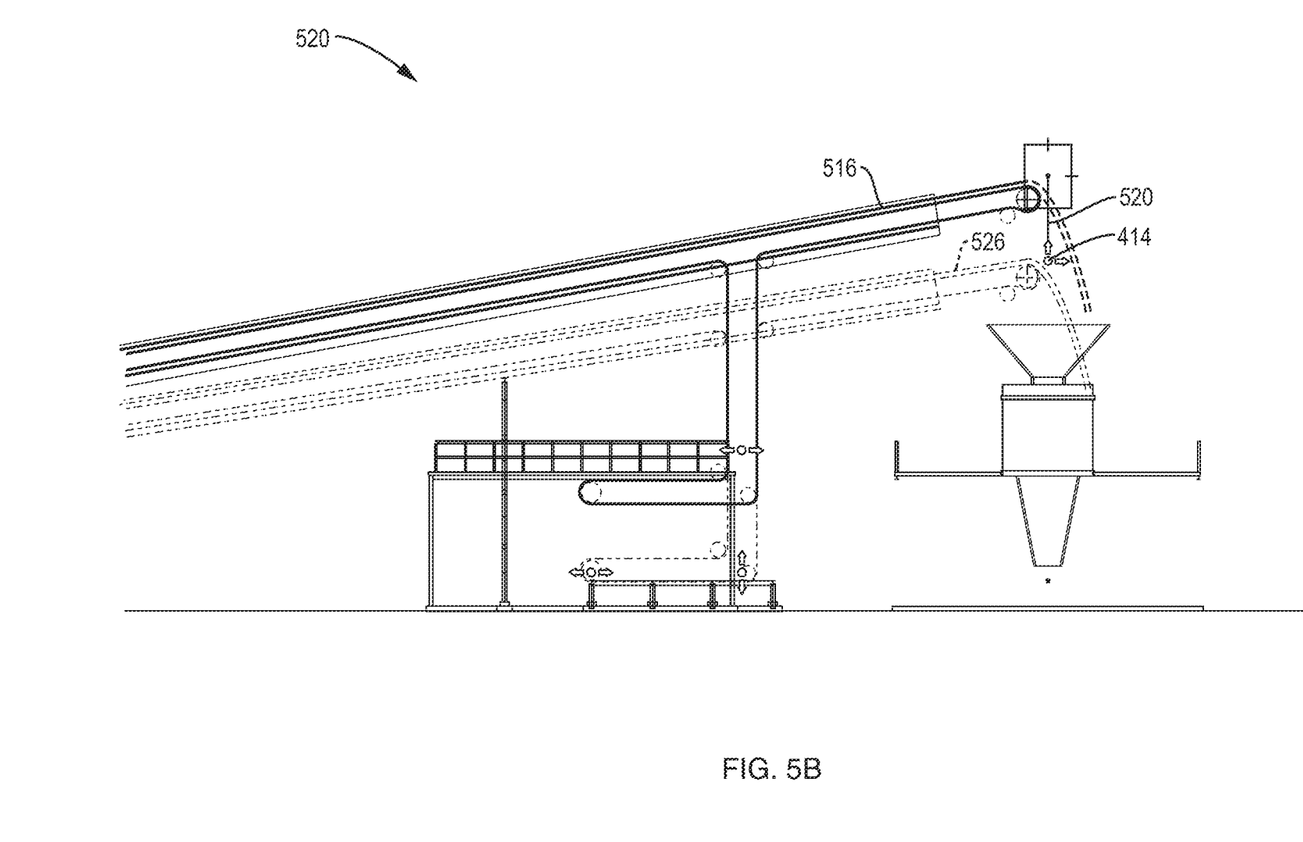
Figure 5C:
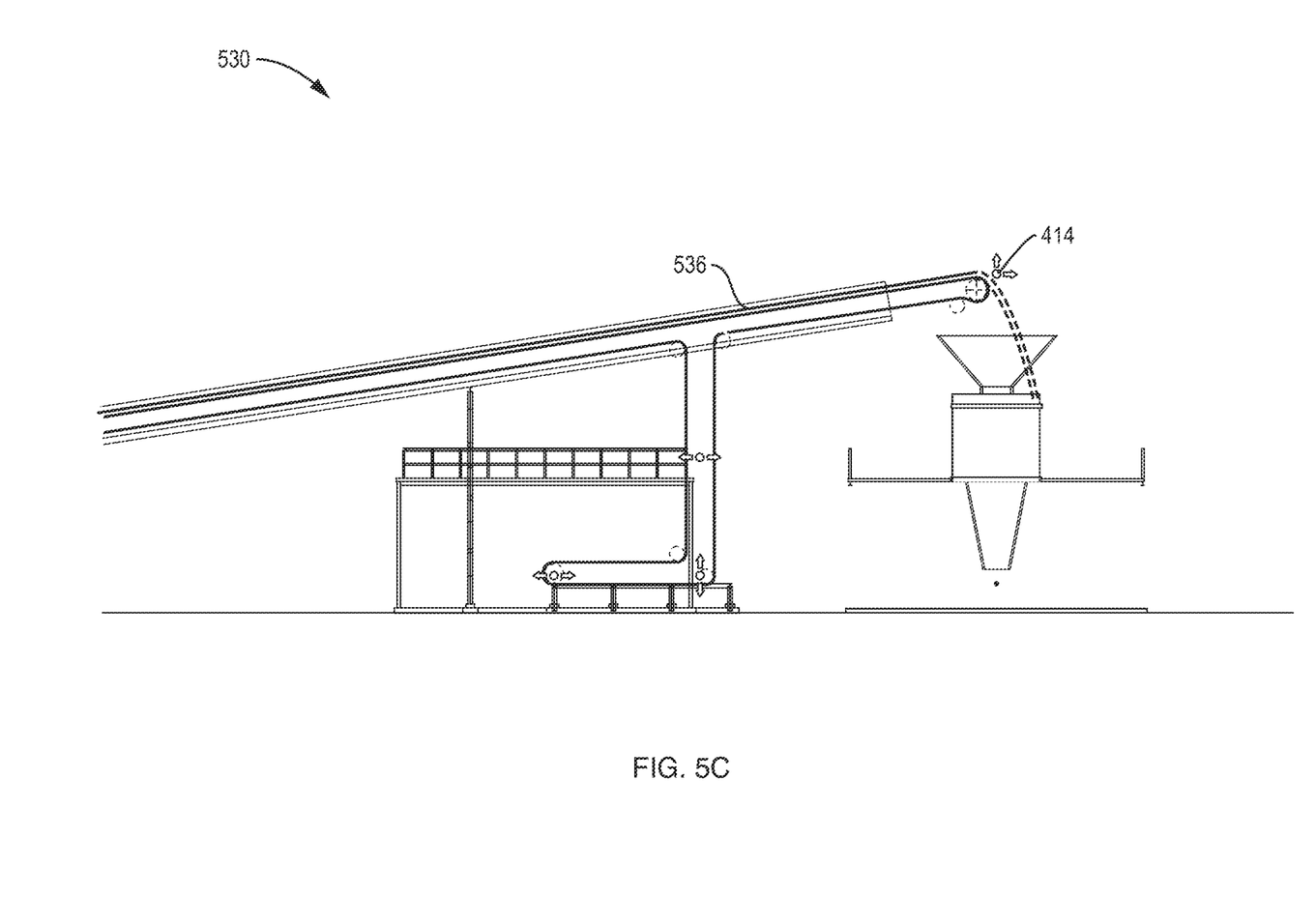

FIGS. 3A-3E are flow diagrams 310-350 showing an example state progression of using a horizontal geometry manipulator to change 2D horizontal geometry and using a vertical geometry manipulator to change 2D vertical geometry of one or more elements. The flow diagrams 310-350 may be better understood with reference to a mining materials handing example where the one or more elements represent a conveyor. FIGS. 4A-4C are a progression of example isometric views 410-430 of a conveyor 416 in the GUI of the CAD application 140, showing a change in 2D horizontal geometry using horizontal geometry manipulators. FIGS. 5A-5C are a progression of example elevation views 510-530 of a conveyor 416 in the GUI of the CAD application 140, showing a change in 2D vertical geometry using vertical geometry manipulators. It should be understood that, while the conveyor 416 may appear 2D in views 510-530, the conveyor 416 is modeled in 3D space in the CAD application 140, and the views are generated from such underlying 3D source.

Figure 3A:
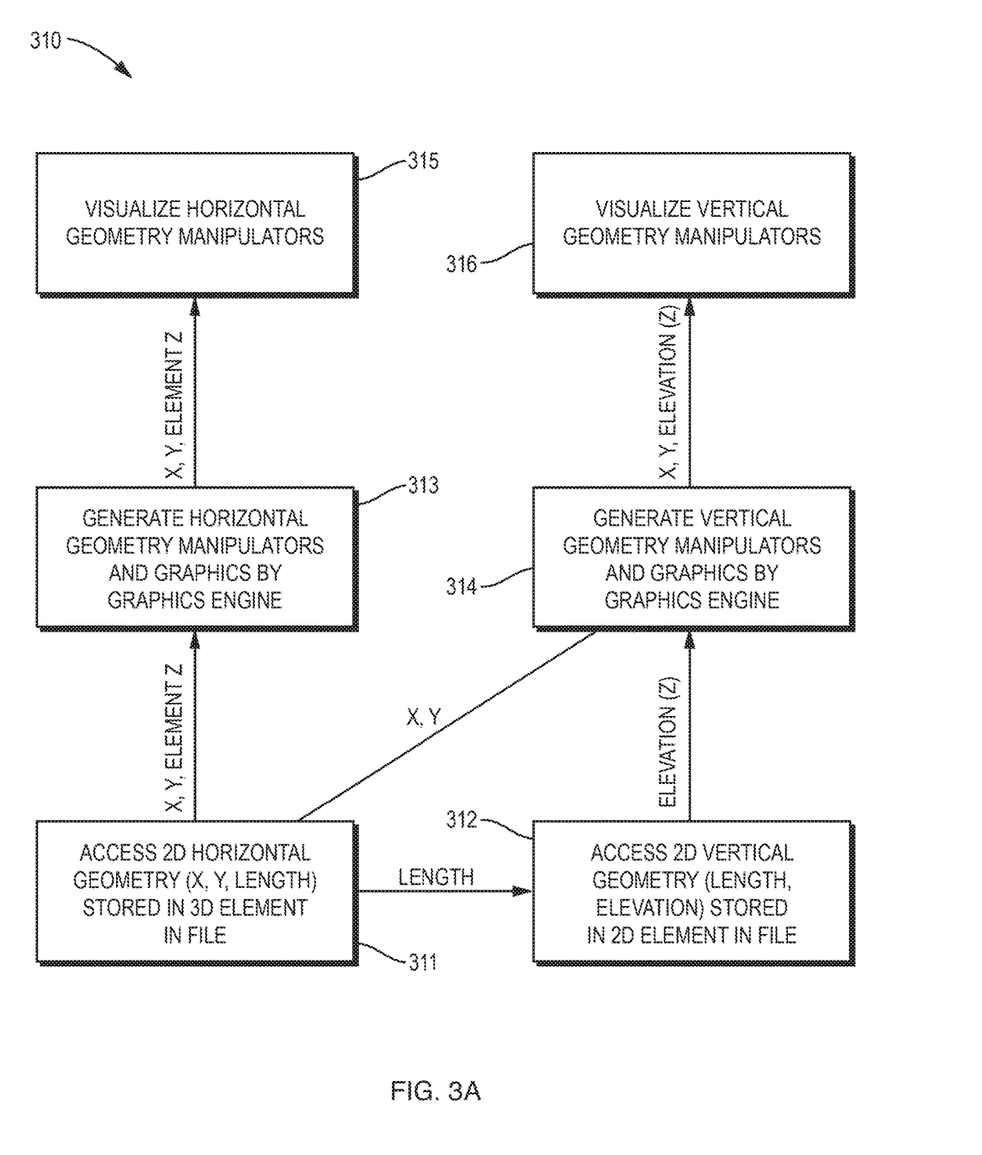
FIGS. 3A-3E are flow diagrams showing an example state progression of using a horizontal geometry manipulator to change 2D horizontal geometry and using a vertical geometry manipulator to change 2D vertical geometry.

In the flow diagram 310 of FIG. 3A, an initial state of the horizontal geometry manipulators and vertical geometry manipulators of one or more elements is displayed in the GUI of the CAD application 140. At step 311, 2D horizontal geometry is accessed from a 3D element stored in a project file 172. The 2D horizontal geometry may be represented by horizontal position (e.g., X and Y coordinates) and length along the one or more elements. At step 312, 2D vertical geometry is accessed from a 2D element stored in a project file 172 and length supplied from step 311. The 2D vertical geometry may be represented by elevation and length along the one or more elements. At step 313, the CAD application uses information derived from the 2D horizontal geometry (e.g., X, Y Element Z) to generate horizontal geometry manipulators each attached along the one or more elements. Likewise, at step 314, the CAD application uses information derived from the 2D horizontal geometry (e.g., X, Y) and the 2D vertical geometry (e.g., Elevation (Z)) to generate vertical geometry manipulators each attached along the one or more elements. As part of both steps 312 and 313, a graphics engine of the CAD application produces user graphics for each of the horizontal geometry manipulators, for example, a sphere that represents the position of the graphics manipulator in 3D space and arrows extending therefrom that represent the orientation of the graphics manipulators in 3D space. The user graphics for horizontal geometry manipulators may be of a first color (e.g., cyan) while the user graphics for vertical geometry manipulators may be of a different second color (e.g., magenta). At step 315, the CAD application 140 visualizes the horizontal geometry manipulators (i.e. shows the user graphics) at appropriate positions within the view of the one or more elements in the GUI of the CAD application 140. Likewise, at step 316, the CAD application visualizes the vertical geometry manipulators at appropriate positions within the view of the one or more elements in the GUI of the CAD application 140.

As can be seen in the example isometric view 410 of FIG. 4A, in their initial state the horizontal geometry manipulators 412 and vertical geometry manipulators 414 are attached along a representation 416 of a conveyor and have certain initial positions in 3D space. For example, in the example elevation view 510 of FIG. 5A, a vertical geometry manipulator 414 is attached about the end of the representation 516 of the conveyor and has a certain initial position.

Figure 3B:
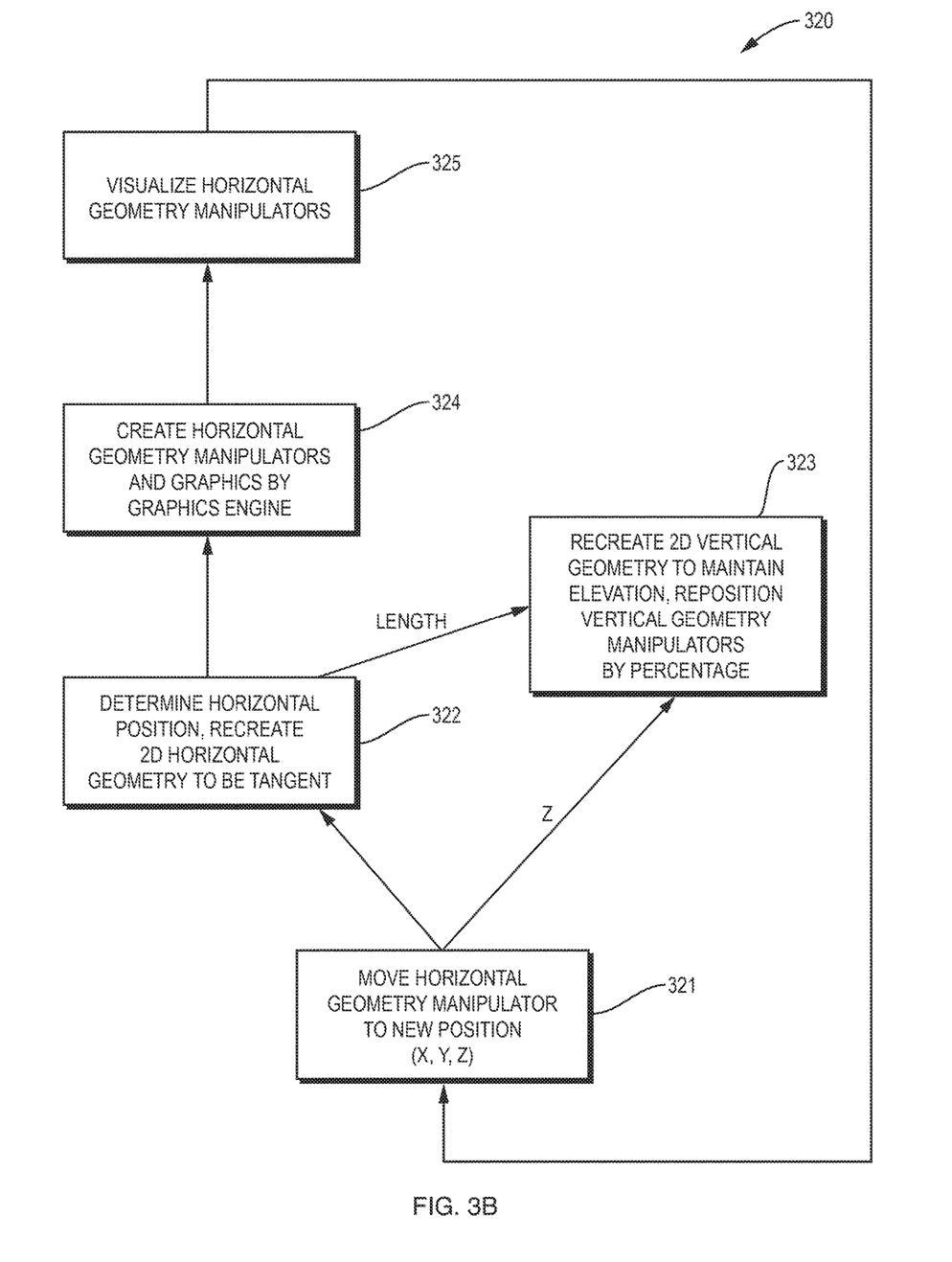

In the flow diagram 320 of FIG. 3B, an interim user-manipulated state of a horizontal geometry manipulator is displayed in the GUI of the CAD application 140. At step 321, user input in the GUI moves a horizontal geometry manipulator to a new position in 3D space (e.g., at X, Y, Z coordinates). The user input may take the form of selecting and dragging the horizontal geometry manipulator with an input device 165. At step 322, the CAD application 140 uses the new position in 3D space to determine a horizontal position, and recreates 2D horizontal geometry of the one or more elements to be tangent to the horizontal position. In this process, the overall length of the one or more elements may be changed. At step 323, the CAD application 140 (e.g., using length and Z coordinates) recreates 2D vertical geometry to maintain elevation (e.g., despite the changed overall length), and repositions the one or more vertical geometry manipulator along the one or more elements (e.g., by percentage along the changed overall length). The changed 2D horizontal geometry is shown in an updated view of the one or more elements in the GUI of the CAD application 140. At step 324, the CAD application uses its graphics engine to create user graphics for the horizontal geometry manipulators. Then, at step 325, the CAD application 140 visualizes the horizontal geometry manipulators at appropriate positions within the view of the one or more elements in the GUI of the CAD application 140. Execution then loops back to step 321.

As can be seen in the example isometric view 420 of FIG. 4B, in an interim user-manipulated state, a horizontal geometry manipulator 412 may be selected and dragged from its initial position over a horizontal displacement 420 to a new position in 3D space. Resulting changed 2D horizontal geometry is shown by an updated representation 426 of the conveyor.

Figure 3C:
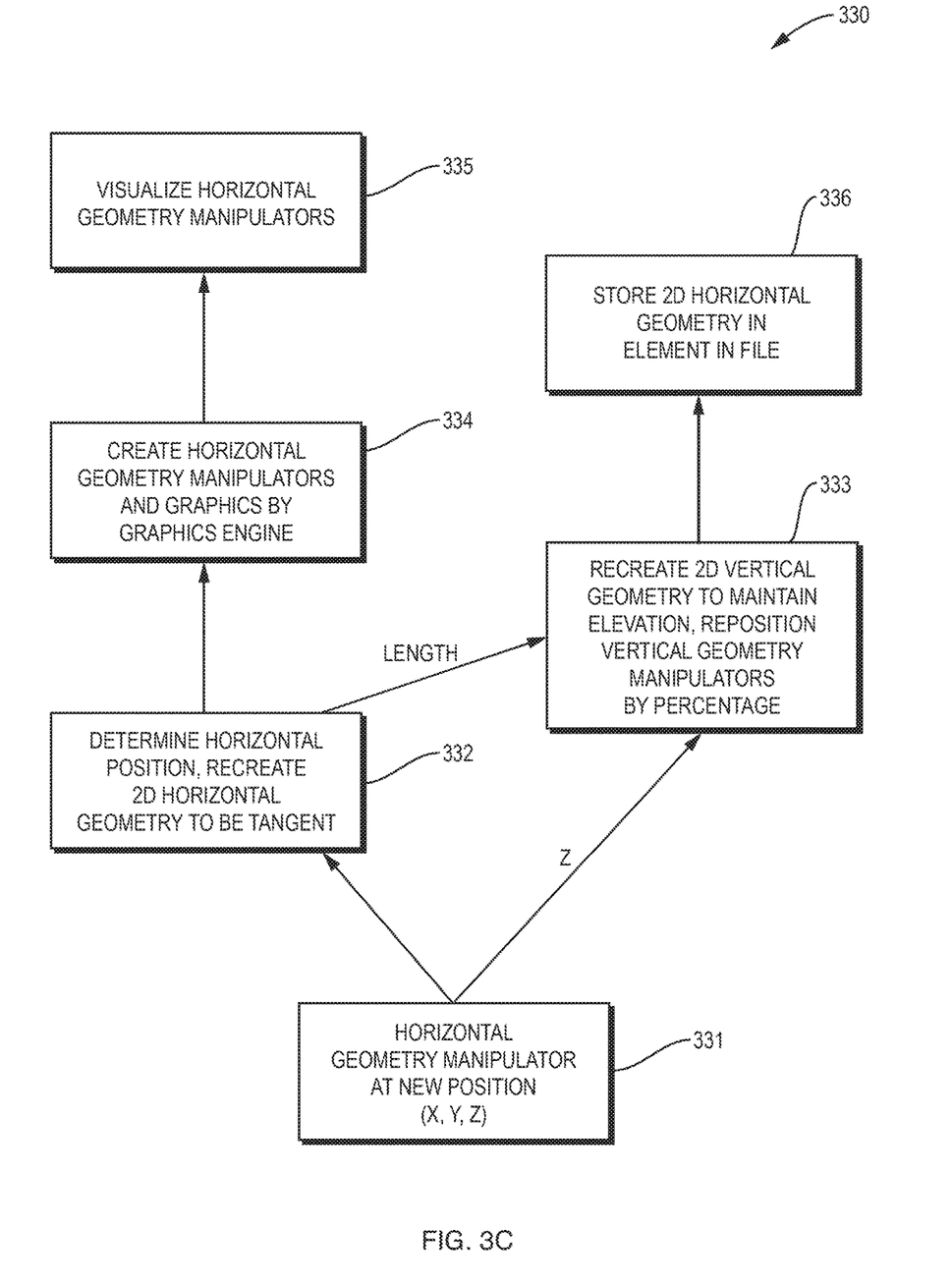

In the flow diagram 330 of FIG. 3C, a final user-manipulated state of a horizontal geometry manipulator is displayed in the GUI of the CAD application 140. At step 321, the horizontal geometry manipulator comes to rest at a final position in 3D space (e.g., at X, Y, Z coordinates). For example, the user may release the horizontal geometry manipulator with the input device 165 at the final position. At step 332, the CAD application 140 uses the final position in 3D space to determine a horizontal position, and recreates 2D horizontal geometry of the one or more elements to be tangent to the horizontal position. Again, this change may alter the overall length of the one or more elements. At step 333, the CAD application 140 (e.g., using length and Z coordinates) recreates 2D vertical geometry to maintain elevation (e.g., despite the changed overall length), and repositions the one or more vertical geometry manipulator along the one or more elements (e.g., by percentage along the changed overall length). At step 334, the CAD application uses its graphics engine to create user graphics for the geometry manipulators. Then at step 335, the CAD application 140 visualizes the horizontal geometry manipulators at appropriate positions within the view of the one or more elements in the GUI of the CAD application 140. At step 336, the 2D horizontal geometry is stored in a 3D element in a project file 172.

As can be seen in the example isometric view 430 of FIG. 4C, in a final user-manipulated state a horizontal geometry manipulator 412 may reside at a final position in 3D space. Resulting 2D horizontal geometry is shown by a final representation 436 of the conveyor.

Figure 3D:
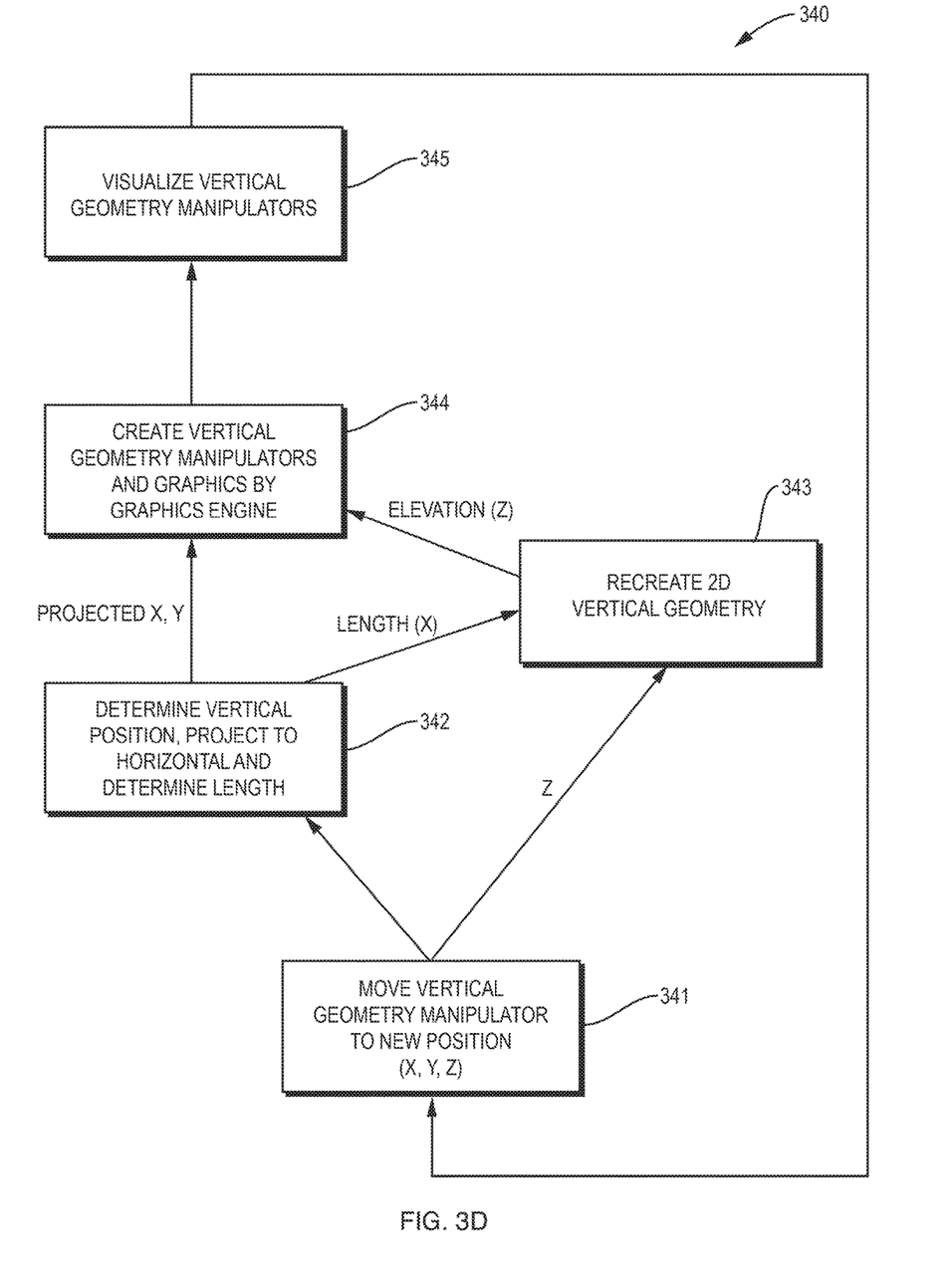

In the flow diagram 340 of FIG. 3D, an interim user-manipulated state of a vertical geometry manipulator is displayed in the GUI of the CAD application 140. At step 341, user input in the GUI moves a vertical geometry manipulator to a new position in 3D space (e.g., at X, Y, Z coordinates). The user input may take the form of selecting and dragging the vertical geometry manipulator with the input device 165. At step 342, the CAD application 140 uses the new position in 3D space to determine a vertical position by projecting the new position in 3D space to a horizontal plane of the one or more elements and determining a length. At step 343, the CAD application 140 (e.g., using length and elevation determined from Z coordinates) recreates 2D vertical geometry. The changed 2D vertical geometry is shown in an updated view of the one or more elements in the GUI of the CAD application 140. At step 344, the CAD application 140 (e.g., using length and elevation) uses its graphics engine to create user graphics for the vertical geometry manipulators. Then, at step 345, the CAD application 140 visualizes the vertical geometry manipulators at appropriate positons within the view of the one or more elements in the GUI of the CAD application 140.

As can be seen in the example elevation view 520 of FIG. 5B, in an interim user-manipulated state a vertical geometry manipulator 414 may be selected and dragged from its initial position over a vertical displacement 520 to a new position in 3D space. Resulting changed 2D vertical geometry is shown by an updated representation 526 of the conveyor.

Figure 3E:
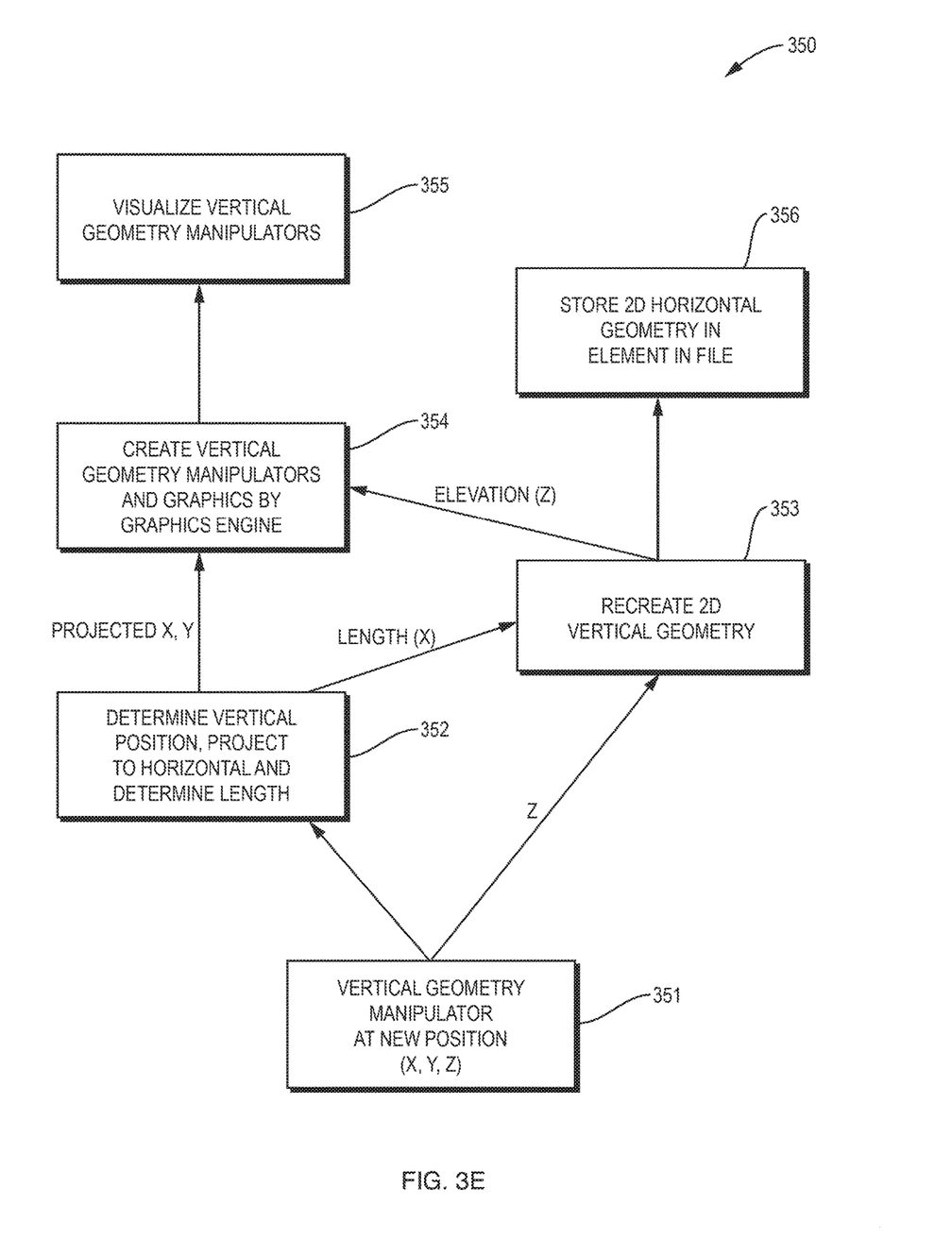

In the flow diagram 350 of FIG. 3E, a final user-manipulated state of a vertical geometry manipulator is displayed in the GUI of the CAD application 140. At step 351, the vertical geometry manipulator comes to rest at a final position in 3D space (e.g., at X, Y, Z coordinates). For example, the user may release the vertical geometry manipulator with an input device 165 at the final position. At step 352, the CAD application 140 uses the final position in 3D space to determine a vertical position by projecting the final position in 3D space to a horizontal plane of the one or more elements and determining a length. At step 353, the CAD application 140 (e.g., using length and elevation determined from Z coordinates) recreates 2D vertical geometry. At step 354, the CAD application 140 (e.g., using length and elevation) uses its graphics engine to create user graphics for the vertical geometry manipulators. Then, at step 355, the CAD application 140 visualizes the vertical geometry manipulators at appropriate positons within the view of the one or more elements in the GUI of the CAD application 140. At step 336, the 2D vertical geometry is stored in a 2D element in a project file 172.

As can be seen in the example elevation view 530 of FIG. 5C, in a final user-manipulated state a vertical geometry manipulator 414 resides at a final position in 3D space. Resulting 2D vertical geometry is shown by a final representation 536 of the conveyor.

The above disclosure details techniques for manipulating the geometry of a generally linear unit of infrastructure represented by the one or more elements in a CAD application using horizontal geometry manipulators and vertical geometry manipulators. It should be understood that a wide range of adaptations and modifications may be made to the above discussed techniques. In general, functionality may be implemented in software, hardware or various combinations thereof. Software implementations may include electronic device-executable instructions (e.g., computer-executable instructions) stored in a non-transitory electronic device-readable medium (e.g., a non-transitory computers readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method for manipulating the geometry of one or more elements that represent a generally linear unit of infrastructure in three-dimensional (3D) space in a computer aided design (CAD) application executing on an electronic device, comprising:
    displaying a view of the one or more elements in a graphical user interface (GUI) of the CAD application shown on a display device of the electronic device, the one or more elements having a two-dimensional (2D) horizontal geometry and a 2D vertical geometry;
    generating one or more horizontal geometry manipulators attached along the one or more elements, each horizontal geometry manipulator visualized in the view and movable in 3D space;
    generating one or more vertical geometry manipulators attached along the one or more elements, each horizontal geometry manipulator visualized in the view and movable in 3D space;
    in response to user input in the GUI moving a horizontal geometry manipulator to a first new position in 3D space, determining a horizontal position along the one or more elements, recreating 2D horizontal geometry of the one or more elements to be tangent to the horizontal position, recreating 2D vertical geometry to maintain elevation, repositioning the one or more vertical geometry manipulators along the one or more elements, and updating the view of the one or more elements in the GUI of the CAD application shown on the display device; and
    in response to user input in the GUI moving a vertical geometry manipulator to a second new position in 3D space, determining a vertical position along the one or more elements, recreating 2D vertical geometry of the one or more elements to adjust elevation based on the vertical position, and updating the view of the one or more elements in the GUI of the CAD application shown on the display device.

2. The method of claim 1, wherein the generally linear unit of infrastructure is a conveyer.

3. The method of claim 1, wherein the one or more elements includes a 3D element and a 2D element that represent the generally linear infrastructure, and the horizontal geometry is maintained in the 3D element and the 2D vertical geometry is maintained in the 2D element.

4. The method of claim 3, wherein the horizontal geometry is represented by horizontal position and length along the one or more elements.

5. The method of claim 3, wherein the vertical geometry is represented by elevation and length along the one or more elements.

6. The method of claim 1, wherein the recreating 2D horizontal geometry changes an overall length of the one or more elements, the recreating 2D vertical geometry is based on a vertical component of the first new position and the changed overall length, and repositioning the one or more vertical geometry manipulators along the one or more elements repositions the one or more vertical geometry manipulators by percentage along the changed overall length.

7. The method of claim 1, wherein the determining the vertical position along the one or more elements comprises projecting the second new position in 3D space to a horizontal plane of the one or more elements and determining a length, and the recreating 2D vertical geometry of the one or more elements is based on the length and an elevation of the second new position.

8. The method of claim 1, wherein each of the horizontal geometry manipulators and the vertical geometry manipulators are represented by a sphere and one or more arrows extending therefrom.

9. The method of claim 1, wherein the horizontal geometry manipulators are shown in a first color and the vertical geometry manipulators are shown in a different second color.

10. A non-transitory electronic device-readable medium containing executable instructions, the executable instructions, when executed by one or more processors of one or more electronic devices operable to:
    display a view of one or more elements that represent a generally linear unit of infrastructure in three-dimensional (3D) space in a graphical user interface (GUI), the one or more elements having a two-dimensional (2D) horizontal geometry and a 2D vertical geometry;
    generate one or more horizontal geometry manipulators attached along the one or more elements, each horizontal geometry manipulator visualized in the view and movable in the 3D space;
    generate one or more vertical geometry manipulators attached along the one or more elements, each horizontal geometry manipulator visualized in the view and movable in the 3D space;

in response to user input in the GUI moving a horizontal geometry manipulator to a first new position in 3D space, determine a horizontal position along the one or more elements, recreate 2D horizontal geometry of one or more elements to be tangent to the horizontal position, recreate 2D vertical geometry to maintain elevation, reposition the one or more vertical geometry manipulators along the one or more elements, and update the view of the one or more elements in the GUI; and in response to user input in the GUI moving a vertical geometry manipulator to a second new position in 3D space, determine a vertical position along the one or more elements, recreate 2D vertical geometry of the one or more elements based on the vertical position, and update the view of the one or more elements in the GUI.

11. The non-transitory electronic device-readable medium of claim 10, wherein the generally linear unit of infrastructure is a conveyer.

12. The non-transitory electronic device-readable medium of claim 10, wherein the one or more elements includes a 3D element and a 2D element that represent the generally linear unit of infrastructure, and the 2D horizontal geometry is maintained in the 3D element and the vertical geometry is maintained in the 2D element.

13. The non-transitory electronic device-readable medium of claim 12, wherein the 2D horizontal geometry is represented by horizontal position and length along the one or more elements.

14. The non-transitory electronic device-readable medium of claim 12, wherein the 2D vertical geometry is represented by elevation and length along the one or more elements.

15. The non-transitory electronic device-readable medium of claim 10, wherein the executable instructions, when executed by the one or more processors of the one or more electronic devices, are further operable to:

change an overall length of the one or more elements;
recreate 2D vertical geometry to maintain elevation based on a vertical component of the first new position and the changed overall length; and
reposition the one or more vertical geometry manipulators along the one or more elements by percentage along the changed overall length.

16. The non-transitory electronic device-readable medium of claim 10, wherein the executable instructions, when executed by the one or more processors of the one or more electronic devices, are further operable to:

project the second new position in 3D space to a horizontal plane of the one or more elements and determine a length;
recreate 2D vertical geometry of the one or more elements based on the length and an elevation of the second new position.

17. An electronic device configured to manipulate the geometry of one or more elements that represent a generally linear unit of infrastructure in three-dimensional (3D) space, the electronic device comprising:

a display screen;
a processor configured to execute executable instructions; and
a memory configured to store the executable instructions and data, the executable instructions and data including:
at least one file storing the one or more elements that represent the generally linear unit of infrastructure, the one or more elements having a two-dimensional (2D) horizontal geometry and a 2D vertical geometry;
a computer aided design (CAD) application that when executed is operable to:
display a view of the one or more elements in three-dimensional (3D) space in a graphical user interface (GUI) of the CAD application shown on the display device,
generate one or more horizontal geometry manipulators attached along the one or more elements, each horizontal geometry manipulator visualized in the view and movable in the 3D space,
generate one or more vertical geometry manipulators attached along the one or more elements, each horizontal geometry manipulator visualized in the view and movable in the 3D space,
in response to user input in the GUI moving a horizontal geometry manipulator to a first new position in 3D space, determine a horizontal position along the one or more elements, recreate 2D horizontal geometry of the one or more elements to be tangent to the horizontal, recreate 2D vertical geometry to maintain elevation, reposition the one or more vertical geometry manipulators along the one or more elements, and update the view of the one or more elements in 3D space in the GUI of the CAD application executing on the electronic device; and
in response to user input in the GUI moving a vertical geometry manipulator to a second new position in 3D space, determine a vertical position along the one or more elements, recreate 2D vertical geometry of the one or more elements to adjust elevation based on the vertical position, update the view of the one or more elements in 3D space in the GUI of the CAD application executing on the electronic device.

18. The electronic device of claim 17, wherein the generally linear unit of infrastructure is a conveyer.

19. The electronic device of claim 17, wherein the one or more elements includes a 3D element and a 2D element that represent the generally linear unit of infrastructure, and the 2D horizontal geometry is maintained in the 3D element and the 2D vertical geometry is maintained in the 2D element.

20. The electronic device of claim 17, wherein the 2D horizontal geometry is represented by horizontal position and length along the one or more elements and the 2D vertical geometry is represented by elevation and length along the one or more elements.

* * * * *